(12) United States Patent
Zhan et al.

(10) Patent No.: US 10,497,696 B2
(45) Date of Patent: Dec. 3, 2019

(54) ELECTROSTATIC DISCHARGE PROTECTION CIRCUIT WITH A BI-DIRECTIONAL SILICON CONTROLLED RECTIFIER (SCR)

(71) Applicant: NXP USA, INC., Austin, TX (US)

(72) Inventors: Rouying Zhan, Chandler, AZ (US); Patrice Besse, Tournefeuille (FR); Alain Salles, Ramonville Saint Agne (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/038,852

(22) Filed: Jul. 18, 2018

(65) Prior Publication Data

US 2019/0074275 A1    Mar. 7, 2019

(30) Foreign Application Priority Data

Sep. 1, 2017   (EP) ..................................... 17306137

(51) Int. Cl.
*H01L 27/02*   (2006.01)
*H01L 29/747*  (2006.01)
*H01L 29/87*   (2006.01)

(52) U.S. Cl.
CPC ........ *H01L 27/0262* (2013.01); *H01L 29/747* (2013.01); *H01L 29/87* (2013.01)

(58) Field of Classification Search
CPC .............................. H01L 27/0262; H01L 23/60
USPC ....................................................... 257/173
See application file for complete search history.

(56) References Cited

U.S. PATENT DOCUMENTS

| 9,287,255 | B2 | 3/2016 | Zhan et al. | |
| 2009/0273006 | A1* | 11/2009 | Chen | H01L 27/0262 257/173 |
| 2013/0032882 | A1 | 2/2013 | Salcedo et al. | |
| 2013/0242448 | A1* | 9/2013 | Salcedo | H01L 27/0259 361/111 |
| 2014/0111892 | A1 | 4/2014 | Chen et al. | |
| 2014/0367830 | A1* | 12/2014 | Zhan | H01L 27/0262 257/577 |
| 2015/0221629 | A1 | 8/2015 | Besse et al. | |
| 2016/0300832 | A1* | 10/2016 | Besse | H01L 27/0259 |

FOREIGN PATENT DOCUMENTS

WO   WO-2011/144960 A1   11/2011

* cited by examiner

*Primary Examiner* — Steven H Loke
*Assistant Examiner* — Brandon C Fox (57) ABSTRACT

An electrostatic discharge (ESD) protection device includes a first bi-directional silicon controlled rectifier having a doped well of a first conductivity type, a buried doped layer having a second conductivity type opposite the first conductivity type, first and second highly doped regions of the second conductivity type in the doped well, and a third highly doped region of the first conductivity type in the doped well. The first, second and third highly doped regions are connected to a first node. A first transistor in the doped well includes an emitter coupled to the first highly doped region, a collector coupled to a conductive line in the buried doped layer, and a base coupled to the third highly doped region. A second transistor in the doped well includes an emitter coupled to the second highly doped region, a collector coupled to the conductive line in the buried doped layer, and a base coupled to the third highly doped region.

18 Claims, 5 Drawing Sheets

ELECTROSTATIC DISCHARGE PROTECTION CIRCUIT WITH A BI-DIRECTIONAL SILICON CONTROLLED RECTIFIER (SCR)

CROSS-REFERENCE TO RELATED APPLICATIONS

This application claims the priority under 35 U.S.C. § 119 of European Patent application no. 17306137.5, filed on Sep. 1, 2017, the contents of which are incorporated by reference herein.

BACKGROUND

Field

This disclosure relates generally to integrated circuits, and more specifically, to an Electrostatic Discharge (ESD) protection circuit with a bi-directional SCR.

Related Art

Electrostatic discharge (ESD) is a problem in the utilization, manufacturing and/or design of the semiconductor devices. The integrated circuits manufactured on the semiconductor device can be damaged when ESD events are received from other circuits coupled to the semiconductor device or from people and/or machinery and tools touching the semiconductor device. During an ESD event the integrated circuit may receive a charge which leads to relatively large currents during a relatively short period of time. As the result of the large current (until several amps during tens of nanoseconds), the voltage inside the IC increases. If the resulting voltage, current, power or energy exceed a maximum capability of the circuits then it may create irreparable damage to the integrated circuit.

Today most integrated circuits include ESD protection circuitries that are able to conduct the charge of an ESD event to, for example, the ground without causing irreparable damage to the integrated circuit. Such ESD protection circuits are typically arranged near the I/O pads of the semiconductor device and are configured to conduct the charge of the ESD event directly to the ground before the current may reach the vulnerable portions of the integrated circuit.

Figure 1:
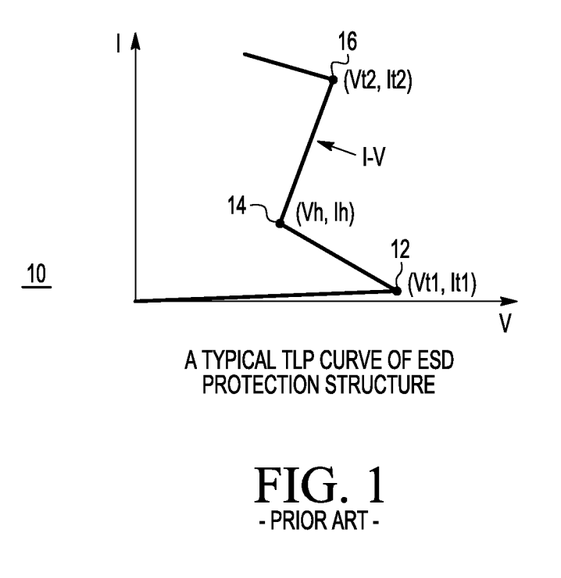
FIG. 1 illustrates a typical TLP curve of a prior art ESD protection circuit.

One type of ESD circuit used today includes a bi-directional Silicon Controlled Rectifier (SCR) coupled with a PNP transistor. Note that a SCR (or a thyristor) is formed when the base of a PNP transistor is coupled to the collector of an NPN transistor. In the event of an ESD event of a positive voltage on an input/output (I/O) pad, such an ESD protection circuit can conduct large currents, thus protecting the IC. For example, FIG. 1 illustrates the typical behavior as a Transmission Line Pulse (TLP) curve of such an ESD protection device. As shown in FIG. 1, if the voltage of the ESD event raises to the trigger voltage Vt1 at point 12, the operation of the ESD protection circuit is triggered in which the SCR becomes activated, causing a reduction in voltage across the ESD protection circuit. This reduction of the voltage is referred to as the "snapback voltage." Therefore, after reaching the trigger voltage Vt1, the voltage drops towards the holding voltage Vh at point 14. The difference between the trigger voltage Vt and the holding voltage Vh is the snapback voltage Vsb. Subsequently, the ESD protection device is capable of conducting larger currents to protect the IC until the ESD protection device is damaged at point 16.

Typically, there is a requirement that the holding voltage be a particular amount to be able to provide latchup immunity. The higher the holding voltage, a better quality and robustness can be achieved as it helps prevent against the risk of latchup. Current ESD protection circuits fail to provide a sufficiently high holding voltage, therefore a need exists for an improved ESD protection circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

An ESD protection circuit includes a bi-directional SCR with double emitter regions at the positive terminal when combined with a PNP transistor. The double emitter regions in the SCR results in increasing the holding voltage which may allow for improved latchup immunity.

Figure 2:
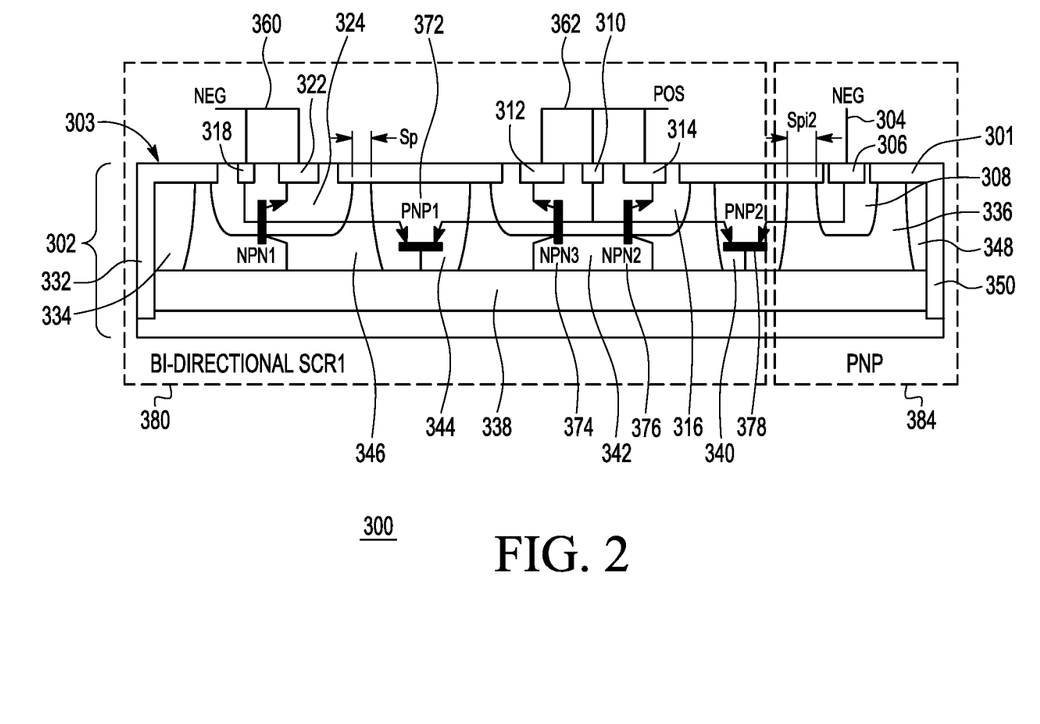
FIG. 2 illustrates, in cross-section form, an ESD protection circuit in accordance with one embodiment of the present invention.

FIG. 2 illustrates in cross-section form, an ESD protection circuit 300 (also referred to as semiconductor device 300) in accordance with one embodiment of the present invention. Only a cross-sectional view is presented and the skilled person knows that it means that the structure extends for some distance in a direction perpendicular to the plane of the figure. Further, as will be discussed hereinafter, some of the structures enclose a region, which means that they extend for some distance in the direction perpendicular to the plane of the figure and subsequently follow a path parallel to the plane of the figure.

Device 300 includes a p-doped substrate 302. P-doped substrate 302 has a first side 303. In an alternate embodiment, p-doped substrate 302 may also be subdivided in two layers. The bottom layer (seen in the orientation as presented in FIG. 2) is a p-doped semiconductor material on which a p-doped epitaxy layer has been manufactured. In this alternate embodiment, the p-doped semiconductor material should be comparable to the p-doped epitaxy layer. Substrate 302 is electrically brought into contact with a substrate voltage or a ground voltage via a substrate connection (not shown).

An isolation structure is formed within substrate 302 to subdivide substrate 302 into a remaining portion and an isolated portion. The isolated portion is enclosed by the isolation structure. The isolation structure includes, at least, an N-buried layer NBL 338 which is arranged inside p-doped substrate 302 at a border between the isolated portion and the remaining portion. NBL 338 is arranged in a lateral direction and is arranged, seen from the first side, below the interface between the isolated portion and the remaining portion. The isolation structure also includes a Deep Trench Isolation structure DTI 332 and 350 which encloses the isolated portion. Note that DTI 332 and 350 are optional. The isolation structure also includes N-doped regions 334 and 348 which extend from the first side 303 towards NBL 338. N-doped regions 334 and 348 are adjacent to the Deep Trench Isolation structure, DTI 332 and 350, and enclose the isolated portion.

A first N-doped region 340 and a second N-doped region 344 are formed in the isolated portion and extend from first side 303 towards NBL 338. First N-doped region 340 and second N-doped region 344 subdivide the isolated portion into a first portion pepi1 336, a second portion pepi2 342, and a third portion pepi3 346. First portion pepi1 336, second portion pepi2 342, and third portion pepi3 346 are non-overlapping with each other.

A first p-doped well region 308, a second p-doped well region 316, and a third p-doped well region 324 are formed in the first portion 336, second portion 342, and third portion 346, respectively. (Each of p-doped well regions 308, 316, and 324 may be referred to as p-doped regions.) Each one of first p-doped region 308, second p-doped region 316, and third p-doped region 324 extend from first side 303 into its corresponding portion pepin 336, 342, and 346, respectively. P-doped regions 308, 316, and 324 do not extend completely to NBL 338. Further, p-doped regions 308, 316, and 324 each have a p-dopant concentration which is higher than the p-dopant concentration of the respective first portion pepi1 336, second portion pepi2 342, and third portion pepi3 346. Shallow trench isolation (STI) regions 301 are also included at first side 303 between the p-doped regions.

A first P contact region 306 is located within first p-doped region 308. P contact region 306 is connected to an electrical connection 304 which is connected to a negative voltage NEG terminal (or node) of device 300. NEG is generally tied to a ground voltage. P contact region 306 is a highly doped P+ region which has a higher p-dopant concentration than the p-dopant concentration of first p-doped region 308.

N contact regions 314 and 312 and P contact region 310 are formed in second p-doped region 316, and an N contact region 322 and a P contact region 318 are formed in third p-doped region 324. N contact regions 314, 312, and 322 and P contact regions 310 and 318 extend from first side 303 into respective P-doped regions, however, they do not extend completely to the bottom of the respective P-doped regions. That is, as seen in a direction from the first side 303, contact regions 310, 314, 312, 318, and 322 are each surrounded by the respective p-doped region 316 or 324. The P contact regions 310 and 318 are highly doped P+ regions and have a p-dopant concentration which is higher than the p-dopant concentration of the P-doped regions 316 and 324. An electrical connection 362 is connected to each of N contact regions 312 and 314 and P contact region 310. Electrical connection 362 is configured to be connected to an I/O pad of the semiconductor device 300, referred to as the positive POS terminal (or node) of device 300. An electrical connection 360 is connected to N contact region 322 and P contact region 318. Electrical connection 360 is configured to be connected to NEG or to a ground voltage.

Note that, in alternate embodiments, the doped regions and contact regions may be formed in different orientations. For example, as seen in a direction from left to right in FIG. 2, N contact region 322 and P contact region 318 may be reversed such that N contact region 322 may be located on the left of P contact region 318. Similarly, the contact regions in p-doped region 324 may be arranged differently.

The structure of the semiconductor device 300 implements a specific electrical circuit. FIG. 2 schematically shows transistors NPN1 370, PNP1 372, NPN3 374, NPN2 376, and PNP2 378 of the circuit. NPN1 370 is formed by the n-p-n junctions from N contact region 322 to p-doped region 324 to NBL 338. PNP1 372 is formed by the p-n-p junctions from p-doped region 324 to N-doped region 344 to p-doped region 316. NPN3 374 is formed by the n-p-n junctions from N contact region 312 to p-doped region 316 to NBL 338. NPN2 376 is formed by the n-p-n junctions from N contact region 314 to p-doped region 316 to NBL 338. PNP2 is formed by the p-n-p junctions from p-doped region 316 to N-doped region 340 to p-doped region 308. Contact region 322 provides a contact to the emitter of NPN1 and contact region 318 provides a contact to the base of NPN1. Contact region 312 provides a contact to the emitter of NPN3 and contact region 314 provides a contact to the emitter of NPN2. Contact region 310 provides a contact to the base of NPN3 and NPN2. Electrical connection 362 electrically connects the emitters of NPN3 and NPN2 such that the combination of NPN3 and NPN2 form a double emitter device.

Figure 3:
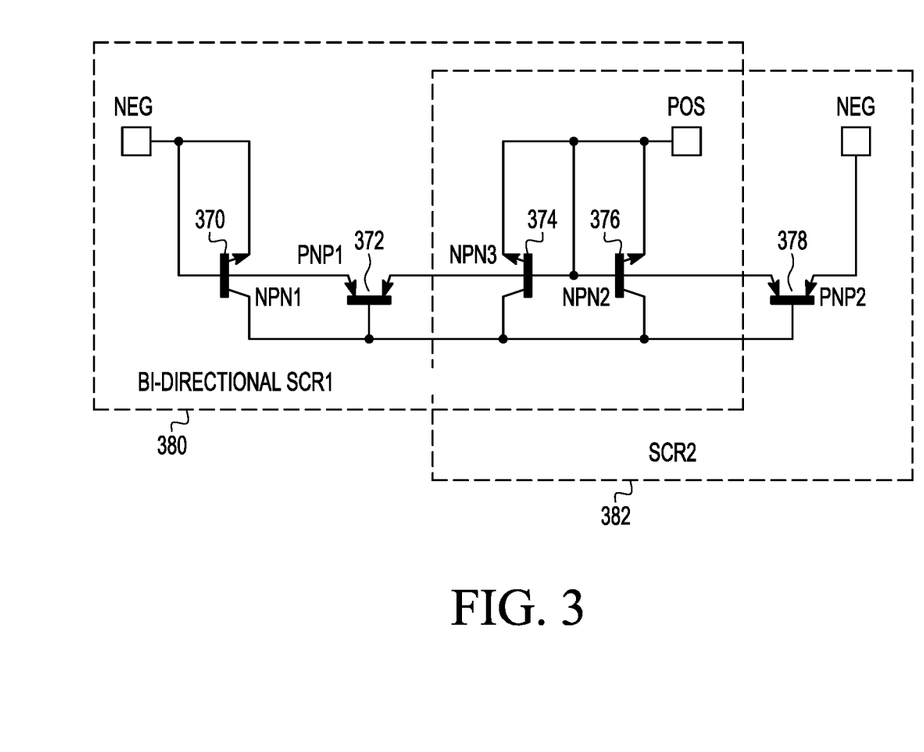
FIG. 3 illustrates, in schematic form, the ESD protection circuit of FIG. 2.

As seen in FIGS. 2 and 3, an emitter of PNP1 is tied to the bases of NPN3 and NPN2, a base of PNP1 is tied to the collector of NPN1, and a collector of PNP1 is tied to the base of NPN1. An emitter of PNP2 is tied to NEG, a base of PNP2 is tied to the collectors of NPN2 and NPN3, and the collector of PNP2 is tied to the bases of NPN3 and NPN2. Therefore, it can be seen that NPN1, PNP1, NPN3, and NPN2 form a first bi-directional SCR 380 having double emitters (i.e. emitters of both NPN3 and NPN2) on the POS terminal. Note that a second SCR 382 is formed by NPN3, NPN2, and PNP2.

In operation, if the voltage across the SCR1 380 increases towards a first trigger voltage Vt1 SCR1 380 starts to operate. When Vt1 is reached the current value through the ESD protection device 300 is equal to the trigger current It1. As soon as SCR1 380 starts its operation, the voltage across SCR1 380 reduces to the holding voltage Vh and from that point onwards, if the current through SCR1 380 increases, the voltage across SCR1 380 increases as well. The first trigger voltage Vt1 strongly depends on a distance Sp (see FIG. 2) between N-doped region 344 and p-doped region 324 along a shortest line through the third portion pepi3 346. Thus, the distance Sp between N-doped region 344 and p-doped region 324 is configured to obtain a first predefined trigger voltage Vt1.

When the voltage across ESD protection device 300 increases, the n-p junction from N-doped region 340 towards p-doped region 308 is reverse biased. As soon as the breakdown voltage of this junction is reached at the second trigger voltage Vt2, an avalanche phenomenon by impact ionization is created through this n-p junction. A hole current flows through from p-doped region 308. The p-doped region is resistive and once the voltage difference between N-doped region 340 and the first p-doped region 308 becomes larger than 0.3 volt, transistor PNP2 starts to operate. As soon as PNP2 starts to operate, the current through PNP2 increases with the voltage across PNP2. The second trigger voltage Vt2 strongly depends on a distance Spi2 (FIG. 2) between p-doped region 308 and N-doped region 340 along a shortest line through of the first portion pepi1 336. Thus, the distance Spi2 between p-doped region 308 and N-doped region 340 is configured to obtain a first predefined trigger voltage Vt2.

In one embodiment, SCR1 380 is configured to have a first trigger voltage Vt1 which is larger than the second trigger voltage Vt2. Thus, the second trigger voltage Vt2 is reached first when the voltage across ESD protection device 300 increases. Consequently PNP2 is switched on first and initially conducts away a current of the ESD event towards the NEG terminal. If, after the start of the operation of PNP2, the voltage across ESD protection device 300 still increases, the first trigger voltage Vt1 may be reached and SCR1 380 is also switched on to conduct more current of the ESD event towards the NEG terminal. This may result in snapback behavior. However, the snapback behavior is only observed at a snapback current Isb which is much higher than the trigger current It1 of SCR1 380.

Note that SCR1 380 includes two emitter regions contacted by contact 312 and 314 and a base region contacted by contact 310. Both emitter regions and the base region are connected to the POS terminal by way of electrical connection 362. In a forward polarity situation in which the POS terminal is biased high with reference to the NEG terminal, the main current flow from base contact 310 at the POS terminal to the emitter contact 322 at the NEG terminal. The additional emitter region provided by NPN3 and contact 312 is in the main current flow. In the case of the forward polarity situation, with the emitter contact 312 shorted to the POS terminal, the n-p junction formed by contact 312 and P-doped region 316 would be reverse biased. This resulting higher field would modulate the forward current flow, resulting in a higher Vh than would be achievable with only a single emitter region of SCR 380 (i.e. with NPN2 but without NPN3). This higher holding voltage can allow device 300 to meet specifications which require a higher holding voltage than previously possible with prior art SCR devices. This may allow for improved latchup immunity.

Figure 4:
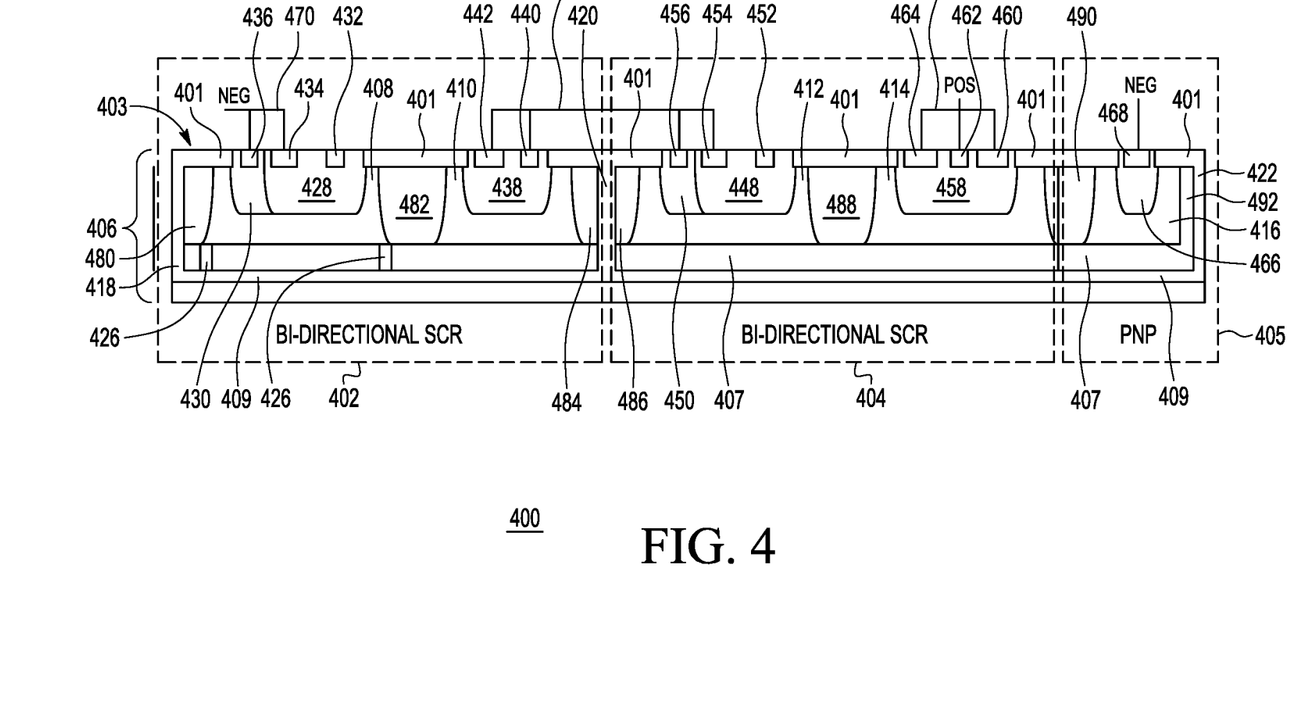
FIG. 4 illustrates, in cross-section form, an ESD protection circuit in accordance with another embodiment of the present invention.

FIG. 4 illustrates, in cross-section form, an ESD protection circuit 400 in accordance with another embodiment of the present invention. In FIG. 4, a bi-directional SCR 402 is coupled in series with a bi-directional SCR 404 having a double emitter region, and a PNP transistor 405 coupled in parallel with SCR 404. In the illustrated embodiment, SCR 402 may be an SCR as known in art, such as one having a single emitter region, and SCR 404 may be similar to SCR1 380 described above having a double emitter region formed by NPN3 374 and NPN2 376.

Device 400 includes a substrate 406. P-doped substrate 406 has a first side 403. In an alternate embodiment, substrate 406 may also be subdivided in two layers. The bottom layer (seen in the orientation as presented in FIG. 4) is a p-doped semiconductor material on which a p-doped epitaxy layer has been manufactured. In this alternate embodiment, the p-doped semiconductor material should be comparable to the p-doped epitaxy layer. Substrate 406 is electrically brought into contact with a substrate voltage or a ground voltage via a substrate connection (not shown). In an alternate embodiment, a buried oxide layer (BOX) can be located between substrate 406 and the p-doped epitaxy layer. In this case, substrate 406 can be either n-type or p-type.

An isolation structure is formed within substrate 406 to subdivide substrate 406 into a remaining portion and an isolated portion. The isolated portion is enclosed by the isolation structure. The isolation structure include, at least, a buried oxide layer BOX 409 which is arranged in a lateral direction inside p-doped substrate 406 at a border between the isolated portion and the remaining portion. The isolation structure also includes an N-buried layer NBL 407, arranged in a lateral direction, above BOX 409. The isolation structure also includes a Deep Trench Isolation structure DTI 418 and 422 which, along with BOX 409, enclose the isolated portion. Note that DTI 418, 420, and 422 are optional. The isolation structure also includes N-doped regions 480, 484, 486, 488, and 492 which extend from the first side 403 towards NBL 407. N-doped region 480 is adjacent to DTI 418 and N-doped regions 484 and 486 are adjacent to DTI 420. Note that if DTI 430 were not present, N-doped regions 484 and 486 could form a single N-doped region. N-doped region 492 is adjacent DTI 422.

An N-doped region 482, an N-doped region 488, and an N-doped region 490 are formed in the isolated portion and extend from first side 403 towards NBL 507. N-doped region 482, N-doped region 488, and N-doped region 490, along with N doped regions 484 and 486, subdivide the isolated portion into a first portion pepi1 408, a second portion pepi2 410, a third portion pepi3 412, a fourth portion pepi4 414, and a fifth portion pepi5 416. First portion pepi1 408, second portion pepi2 410, third portion pepi3 412, fourth portion pepi4 414, and fifth portion pepi5 416 are non-overlapping with each other. Isolation regions 426 are formed within NBL 407 at the bottom of first portion pepi1 408 such that NBL 407 is not continuous under first portion pepi1 408.

A p-doped well region 428 and a p-doped well region 430 is formed in first portion 408, a p-doped well region 438 is formed in second portion 410, a p-doped well region 450 and a p-doped well region 448 is formed in third portion 412, a p-doped region 458 is formed in fourth portion 414, and a p-doped region 466 is formed in fifth portion 416. (EAc of p-doped well regions 428, 430, 438, 450, and 448 may be referred to as p-doped regions.) Each one of these p-doped regions extend from first side 403 into its corresponding portion pepin, respectively, and do not extend completely to the NBL 407. Further, p-doped regions 428, 430, 438, 450, 448, 458, and 466 each have a p-dopant concentration which is higher than the p-dopant concentration of the respective first, second, third, fourth, and fifth portions. Also, P-doped regions 430 and 428 may be considered portions of a same well, and p-doped regions 450 and 448 may be considered portions of a same well. P-doped regions 430 and 450 are high voltage well regions. Shallow trench isolation (STI) regions 401 are also included at first side 403 between the p-doped regions A P contact region 436 is located within p-doped region 430. An N contact region 434 and a P contact region 432 are located within p-doped region 428. P contact region 436 and N contact region 434 are connected to an electrical connection 470 which is connected to a negative voltage NEG terminal (or node) of device 400. NEG is generally tied to a ground voltage. N contact region N+ 442 and P contact region 440 are located in p-doped region 438. A P contact region 456 is located within p-doped region 450. An N contact region 454 and a P contact region 452 are located within p-doped region 448. N contact region 442, P contact region 440, P contact region 456, and N contact region 454 are connected to each other with an electrical connection 472. An N contact region 464, a P contact region 462, and an N contact region 460 are located in p-doped region 458. An electrical connection 474 is connected to each of N contact regions 464 and 460 and P contact region 462. Electrical connection 474 is configured to be connected to an I/O pad of the semiconductor device 400, referred to as the positive POS) terminal (or node) of device 400. A P contact region 468 is located in p-doped region 466 and is configured to be connected to NEG or to a ground voltage. Note that P contact regions are highly doped P+ regions and have a p-dopant concentration that is higher than the p-dopant concentration of p-doped regions 428, 438, 448, 458, and 466. Also, the N contact regions are highly doped N+ regions which have a higher dopant concentration than N-doped regions 480, 482, 484, 486, 488, 490, and 492. Note that, in alternate embodiments, the doped regions and contact regions may be formed in different orientations. Similarly, the contact regions may be arranged differently.

Figure 5:
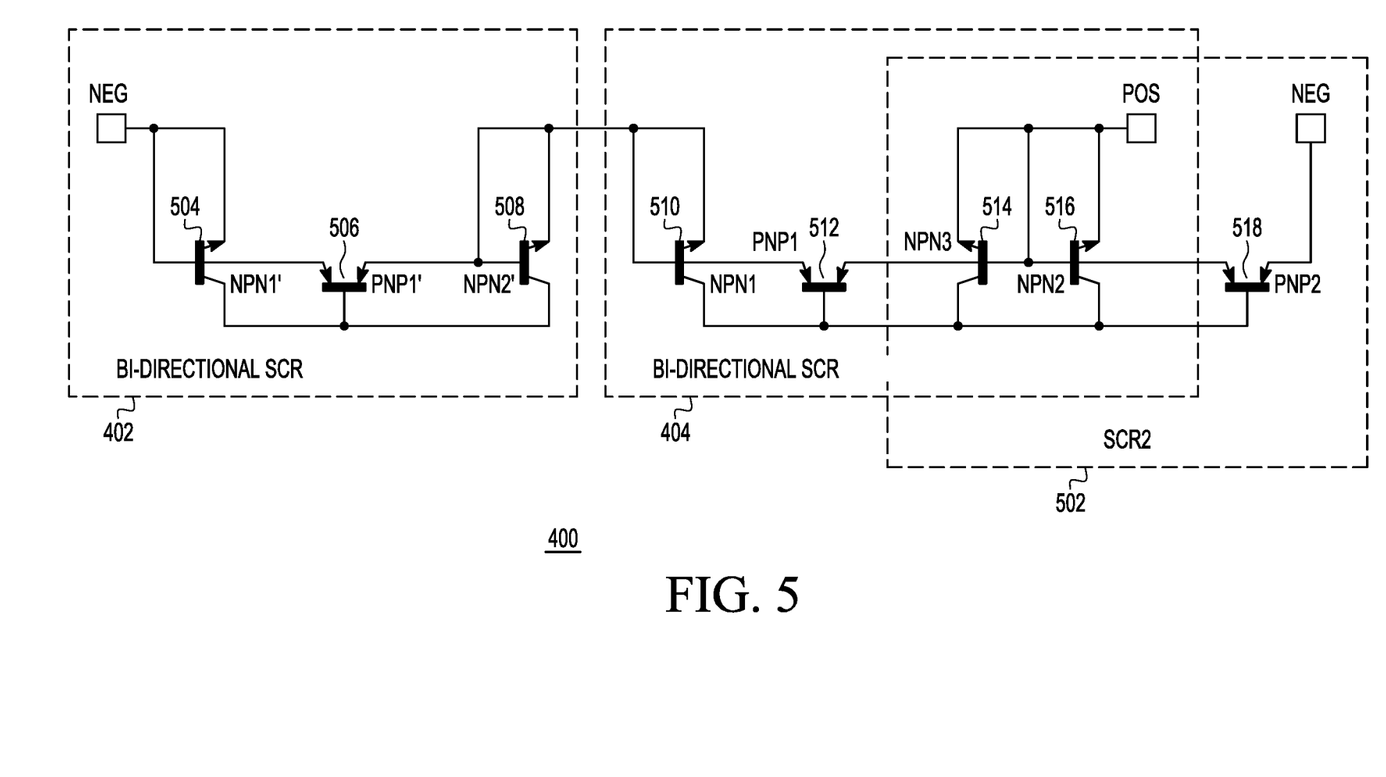
FIG. 5 illustrates, in schematic form, the ESD protection circuit of FIG. 4

The structure of the semiconductor device 400 implements a specific electrical circuit. FIG. 5 schematically shows transistors NPN1' 504, PNP1' 506, NPN2' 508, NPN1 510, PNP1 512, NPN3 514, NPN2 516, and PNP2 518 of the circuit. These transistors are relevant for a situation in which an ESD event is received. The corresponding circuit diagram of the electrical circuit implemented in the semiconductor device 400, in case that an ESD event (either forward or reverse ESD event) is received, is presented in FIG. 5. NPN1' 504 is formed by the n-p-n junctions from N contact region 434 to p-doped region 428 to NBL 407. PNP1' 506 is formed by the p-n-p junctions from p-doped region 428 to N-doped region 482 to p-doped region 438. NPN2' 508 is formed by the n-p-n junction from N contact region 442 to p-doped region 438 to NBL 407. NPN1 510 is formed by the n-p-n junctions from N contact region 454 to p-doped region 448 to NBL 407. PNP1 512 is formed by the p-n-p junctions from p-doped region 448 to N-doped region 488 to p-doped region 458. NPN3 514 is formed by the n-p-n junctions from N contact region 464 to p-doped region 458 to NBL 407. NPN2 516 is formed by the n-p-n junctions from N contact region 460 to p-doped region 458 to NBL 407. PNP2 is formed by the p-n-p junctions from p-doped region 458 to N-doped region 490 to p-doped region 466.

Contact region 436 provides a contact to the base of NPN1' 504 and contact region 434 provides a contact to the emitter of NPN1' 504. Contact region 442 provides a contact to the emitter of NPN2' 508 and contact region 440 provides a contact to the base of NPN2' 508. Contact region 456 provides a contact to the base of NPN1 510 and contact region 454 provides a contact to the emitter of NPN1 510. Contact region 464 provides a contact to the emitter of NPN3 514, contact region 460 provides a contact to the emitter of NPN2 516, and contact region 462 provides a contact to the base of NPN3 514 and NPN2 526. Electrical connection 474 electrically connects the emitters of NPN3 514 and NPN2 516 such that the combination of NPN3 and NPN2 form a double emitter device.

Referring to FIGS. 4 and 5, an emitter of PNP1' is tied to the base of NPN2', a base of PNP1' is tied to the collectors of NPN1' and NPN2', and a collector of PNP1' is tied to the base of NPN1'. The base of NPN1' and the emitter of NPN1' are tied to the NEG terminal. An emitter of NPN2', the base of NPN2', the base of NPN1, and the emitter of NPN1 are all tied together. An emitter of PNP1 is tied to the bases of NPN3 and NPN2, a base of PNP1 is tied to the collector of NPN1, and a collector of PNP1 is tied to the base of NPN1. An emitter of PNP2 is tied to NEG, a base of PNP2 is tied to the collectors of NPN3 and NPN2, and the collector of PNP2 is tied to the bases of NPN3 and NPN2. The base and emitters of NPN3 and NPN2 are electrically connected to the POS terminal. Therefore, it can be seen that NPN1, PNP1, NPN3, and NPN2 form a first bi-directional SCR 404 having double emitters (i.e. emitters of both NPN3 and NPN2) on the POS terminal. A second SCR 402 is formed by NPN1', PNP1', and NPN2'. Note that a third SCR 502 is formed by NPN3, NPN2, and PNP2.

Similar to FIGS. 2 and 3 discussed above, note that SCR1 404 includes two emitter regions contacted by contact 464 and 460 and a base region contacted by contact 462. Both emitter regions and the base region are connected to the POS terminal by way of electrical connection 474. In a forward polarity situation in which the POS terminal is biased high with reference to the NEG terminal, the main current flow is from base contact 462 at the POS terminal to emitter contact 454 at the NEG terminal and through SCR 404. The additional emitter region provided by NPN3 and contact 464 is therefore in the main current flow. In the case of the forward polarity situation, with the emitter contact 464 shorted to the POS terminal, the n-p junction formed by contact 464 and P-doped region 458 would be reverse biased. This resulting higher field would modulate the forward current flow, resulting in a higher Vh that would be achievable with only a single emitter region of SCR 404 (i.e. with NPN2 but without NPN3). This higher holding voltage can allow device 400 to meet specifications which require a higher holding voltage than previously possible with prior art SCR devices. This may allow for improved latchup immunity.

Therefore, by now it can be appreciated how the use of an SCR device with a double emitter region may allow for an increased holding voltage for an ESD protection device. This increased holding voltage, as compared to prior art ESD protection circuits, improves latchup immunity. A higher holding voltage helps ensure that the holding voltage is greater than any normal operating voltage in the integrated circuit. This results in an ESD protection device that is more robust in that it prevents against the risk of latchup until higher operating voltages.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the arrangement of the doped regions and contacts may differ. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an electrostatic discharge (ESD) protection device includes a first bi-directional silicon controlled rectifier (SCR) which includes a substrate; a first doped well in the substrate, the first doped well having a first conductivity type; a buried doped layer in the substrate, the buried doped layer having a second conductivity type opposite the first conductivity type; first and second highly doped regions of the second conductivity type in the first doped well; a third highly doped region of the first conductivity type in the first doped well, wherein the first, second and third highly doped regions are connected to a first node; a first transistor in the first doped well, the first transistor including an emitter coupled to the first highly doped region, a collector coupled to a first conductive line in the buried doped layer, and a base coupled to the third highly doped region; a second transistor in the first doped well, the second transistor including an emitter coupled to the second highly doped region, a collector coupled to the first conductive line in the buried doped layer, and a base coupled to the third highly doped region. In one aspect of this embodiment, the first SCR further includes a first doped substrate region having the second conductivity type; a second doped well in the substrate, the second doped well having the first conductivity type; a fourth highly doped region of the first conductivity type in the second doped well; a third transistor in the first doped substrate region, the third transistor including a first emitter connected to the third highly doped region, a base coupled to the first conductive line and a second emitter connected to the fourth highly doped region. In a further aspect, the first SCR further includes a third doped well in the substrate, the third doped well having the first conductivity type; a fifth highly doped region of the second conductivity type in the third doped well; a sixth highly doped region of the first conductivity type in the third doped well, wherein the fifth and sixth highly doped regions are connected to a second node; a fourth transistor in the third doped well, the fourth transistor including an emitter coupled to the fifth highly doped region, a collector coupled to the first conductive line in the buried doped layer, and a base coupled to the sixth highly doped region. In yet a further aspect, the first SCR further includes a second doped substrate region having the second conductivity type; a fifth transistor in the second doped substrate region, the fifth transistor including a first emitter connected to the third highly doped region, a base coupled to the first conductive line and a second emitter connected to the sixth highly doped region and the base of the base of the fourth transistor. In an even further aspect, the ESD protection device further includes a second SCR including a fourth doped well in the substrate, the fourth doped well having the first conductivity type; a seventh highly doped region of the second conductivity type in the fourth doped well; an eighth highly doped region of the first conductivity type in the fourth doped well, wherein the seventh and eighth highly doped regions are connected to a third node; a sixth transistor in the fourth doped well, the sixth transistor including an emitter coupled to the seventh highly doped region, a collector coupled to a second conductive line in the buried doped layer, and a base coupled to the eighth highly doped region. In yet a further aspect, the second SCR further includes a fifth doped well in the substrate, the fifth doped well having the first conductivity type; a ninth highly doped region of the second conductivity type in the fifth doped well; a tenth highly doped region of the first conductivity type in the fifth doped well, wherein the ninth and tenth highly doped regions are connected to the second node; a seventh transistor in the fifth doped well, the seventh transistor including an emitter coupled to the tenth highly doped region, a collector coupled to the second conductive line in the buried doped layer, and a base coupled to the tenth highly doped region. In yet an even further aspect, the second SCR further includes a third doped substrate region having the second conductivity type; an eighth transistor in the third doped substrate region, the eighth transistor including a first emitter coupled to the eighth highly doped region, a second emitter coupled to the ninth highly doped region, and a base coupled to the second conductive line. In yet a further aspect, the ESD protection device further includes a portion of the fourth doped well that includes the eighth highly doped region is a high voltage doped well; and a portion of the third doped well that includes the sixth highly doped region is a high voltage doped well. In another aspect, the ESD protection device further includes an isolation region in the buried layer below the fourth doped well. In another aspect, the ESD protection device further includes a portion of the first, second, third, fourth and fifth doped wells is a doped epitaxial layer.

In another embodiment, an electrostatic discharge (ESD) protection device includes a first bi-directional silicon controlled rectifier in a semiconductor substrate that includes a first doped well of a first conductivity type; a first transistor in the first doped well that has an emitter connected to a first electrode of a second conductivity type, a collector coupled to a doped buried region of the second conductivity type, and a base connected to a second electrode of the first conductivity type; a second transistor in the first doped well that has an emitter connected to a third electrode of the second conductivity type, a collector coupled to the doped buried region, and a base connected to the second electrode, wherein the first, second and third electrodes are in the first doped well; a first doped substrate region of the second conductivity type adjacent the first doped well; a second doped well of the first conductivity type; and a third transistor in the first doped substrate region that has a first emitter connected to the second electrode, a base coupled to the doped buried region, and a second emitter connected to a fourth electrode of the first conductivity type, wherein the fourth electrode is in the second doped well and the doped buried region is below the first doped substrate region and the first and second doped wells. In one aspect of this another embodiment, the ESD protection device further includes a fourth transistor in the second doped well, the second transistor including an emitter connected to a fifth electrode of the second conductivity type, a collector connected to the doped buried region, and a base connected to the fourth electrode, wherein the fifth electrode is in the second doped well. In a further aspect, the ESD protection device further includes a first node, wherein the first, second and third electrodes are connected to the first node. In yet a further aspect, the ESD protection device further includes a second node, wherein the fourth and fifth electrodes are connected to the second node. In yet an even further aspect, when the first node is biased high with reference to the second node, current flows from the second electrode to the fifth electrode. In another aspect, the ESD protection device further includes a second bi-directional silicon controlled rectifier in the semiconductor substrate that includes: a third doped well of the first conductivity type; a third node; a fifth transistor in the third doped well that has an emitter connected to a sixth electrode of the second conductivity type, a collector connected to the doped buried region, and a base connected to a seventh electrode of the first conductivity type, wherein the sixth and seventh electrodes are in the third doped well and are connected to the third node. In a further aspect, the second bi-directional silicon controlled rectifier further includes: a second doped substrate region of the second conductivity type adjacent the third doped well; a fourth doped well of the first conductivity type; a sixth transistor in the second doped substrate region that has a first emitter connected to the seventh electrode, a base coupled to the doped buried region, and a second emitter connected to an eighth electrode of the second conductivity type, wherein the eighth electrode is in the fourth doped well and the doped buried region is below the second doped substrate region and the third and fourth doped wells. In a further aspect, the second bi-directional silicon controlled rectifier further includes: a seventh transistor in the fourth doped well that has an emitter connected to a ninth electrode of the first conductivity type, a collector connected to the doped buried region, and a base connected to the eighth electrode, wherein the eighth and ninth electrodes are connected to the second node. In another aspect, the ESD protection device further includes a fifth doped well of the first conductivity type; a third doped substrate region of the second conductivity type between the first doped well and the fifth doped well; an eighth transistor in the third doped substrate region that has a first emitter connected to the second electrode, a base coupled to the doped buried region, and a second emitter connected to an eighth electrode of the second conductivity type, wherein the eighth electrode is in the fifth doped well and the doped buried region is below the second doped substrate region and the third and fourth doped wells. In another aspect, the first conductivity type is p-type conductivity; the second conductivity type is n-type conductivity; the first node is a positive node; and the second and third nodes are negative nodes.

What is claimed is:

1. An electrostatic discharge (ESD) protection device comprising:
   a first bi-directional silicon controlled rectifier (SCR) including:
   a substrate;
   a first doped well in the substrate, the first doped well having a first conductivity type;
   a buried doped layer in the substrate, the buried doped layer having a second conductivity type opposite the first conductivity type;
   first and second highly doped regions of the second conductivity type in the first doped well;
   a third highly doped region of the first conductivity type in the first doped well, wherein the first, second and third highly doped regions are connected to a first node;
   a first transistor in the first doped well, the first transistor including an emitter coupled to the first highly doped region, a collector coupled to a first conductive line in the buried doped layer, and a base coupled to the third highly doped region;
   a second transistor in the first doped well, the second transistor including an emitter coupled to the second highly doped region, a collector coupled to the first conductive line in the buried doped layer, and a base coupled to the third highly doped region;
   a first doped substrate region having the second conductivity type;
   a second doped well in the substrate, the second doped well having the first conductivity type;
   a fourth highly doped region of the first conductivity type in the second doped well;
   a third transistor in the first doped substrate region, the third transistor including a first emitter connected to the third highly doped region, a base coupled to the first conductive line and a second emitter connected to the fourth highly doped region.

2. The ESD protection device of claim 1, the first SCR further including:
   a third doped well in the substrate, the third doped well having the first conductivity type;
   a fifth highly doped region of the second conductivity type in the third doped well;
   a sixth highly doped region of the first conductivity type in the third doped well, wherein the fifth and sixth highly doped regions are connected to a second node;
   a fourth transistor in the third doped well, the fourth transistor including an emitter coupled to the fifth highly doped region, a collector coupled to the first conductive line in the buried doped layer, and a base coupled to the sixth highly doped region.

3. The ESD protection device of claim 2, the first SCR further including:
   a second doped substrate region having the second conductivity type;
   a fifth transistor in the second doped substrate region, the fifth transistor including a first emitter connected to the third highly doped region, a base coupled to the first conductive line and a second emitter connected to the sixth highly doped region and the base of the base of the fourth transistor.

4. The ESD protection device of claim 3, further comprising:
   a second SCR including:
   a fourth doped well in the substrate, the fourth doped well having the first conductivity type;
   a seventh highly doped region of the second conductivity type in the fourth doped well;
   an eighth highly doped region of the first conductivity type in the fourth doped well, wherein the seventh and eighth highly doped regions are connected to a third node;
   a sixth transistor in the fourth doped well, the sixth transistor including an emitter coupled to the seventh highly doped region, a collector coupled to a second conductive line in the buried doped layer, and a base coupled to the eighth highly doped region.

5. The ESD protection device of claim 4, the second SCR further including:
   a fifth doped well in the substrate, the fifth doped well having the first conductivity type;
   a ninth highly doped region of the second conductivity type in the fifth doped well;
   a tenth highly doped region of the first conductivity type in the fifth doped well, wherein the ninth and tenth highly doped regions are connected to the second node;

a seventh transistor in the fifth doped well, the seventh transistor including an emitter coupled to the tenth highly doped region, a collector coupled to the second conductive line in the buried doped layer, and a base coupled to the tenth highly doped region.

6. The ESD protection device of claim 5, the second SCR further including:
an third doped substrate region having the second conductivity type;
an eighth transistor in the third doped substrate region, the eighth transistor including a first emitter coupled to the eighth highly doped region, a second emitter coupled to the ninth highly doped region, and a base coupled to the second conductive line.

7. The ESD protection device of claim 6, further comprising:
a portion of the fourth doped well that includes the eighth highly doped region is a high voltage doped well; and
a portion of the third doped well that includes the sixth highly doped region is a high voltage doped well.

8. The ESD protection device of claim 4 further comprising:
an isolation region in the buried layer below the fourth doped well.

9. The ESD protection device of claim 4 further comprising:
a portion of the first, second, third, fourth and fifth doped wells is a doped epitaxial layer.

10. An electrostatic discharge (ESD) protection device comprising:
a first bi-directional silicon controlled rectifier in a semiconductor substrate that includes:
a first doped well of a first conductivity type;
a first transistor in the first doped well that has an emitter connected to a first electrode of a second conductivity type, a collector coupled to a doped buried region of the second conductivity type, and a base connected to a second electrode of the first conductivity type;
a second transistor in the first doped well that has an emitter connected to a third electrode of the second conductivity type, a collector coupled to the doped buried region, and a base connected to the second electrode, wherein the first, second and third electrodes are in the first doped well;
a first doped substrate region of the second conductivity type adjacent the first doped well;
a second doped well of the first conductivity type; and
a third transistor in the first doped substrate region that has a first emitter connected to the second electrode, a base coupled to the doped buried region, and a second emitter connected to a fourth electrode of the first conductivity type, wherein the fourth electrode is in the second doped well and the doped buried region is below the first doped substrate region and the first and second doped wells.

11. The ESD protection device of claim 10, further comprising:
a fourth transistor in the second doped well, the second transistor including an emitter connected to a fifth electrode of the second conductivity type, a collector connected to the doped buried region, and a base connected to the fourth electrode, wherein the fifth electrode is in the second doped well.

12. The ESD protection device of claim 11, further comprising:

a first node, wherein the first, second and third electrodes are connected to the first node; and/or
a second node, wherein the fourth and fifth electrodes are connected to the second node.

13. The ESD protection device of claim 12, further comprising:
a second bi-directional silicon controlled rectifier in the semiconductor substrate that includes:
a third doped well of the first conductivity type;
a third node;
a fifth transistor in the third doped well that has an emitter connected to a sixth electrode of the second conductivity type, a collector connected to the doped buried region, and a base connected to a seventh electrode of the first conductivity type, wherein the sixth and seventh electrodes are in the third doped well and are connected to the third node.

14. The ESD protection device of claim 13, wherein the second bi-directional silicon controlled rectifier further includes:
a second doped substrate region of the second conductivity type adjacent the third doped well;
a fourth doped well of the first conductivity type;
a sixth transistor in the second doped substrate region that has a first emitter connected to the seventh electrode, a base coupled to the doped buried region, and a second emitter connected to an eighth electrode of the second conductivity type, wherein the eighth electrode is in the fourth doped well and the doped buried region is below the second doped substrate region and the third and fourth doped wells.

15. The ESD protection device of claim 14, wherein the second bi-directional silicon controlled rectifier further includes:
a seventh transistor in the fourth doped well that has an emitter connected to a ninth electrode of the first conductivity type, a collector connected to the doped buried region, and a base connected to the eighth electrode, wherein the eighth and ninth electrodes are connected to the second node.

16. The ESD protection device of claim 10, further comprising:
a fifth doped well of the first conductivity type;
a third doped substrate region of the second conductivity type between the first doped well and the fifth doped well;
an eighth transistor in the third doped substrate region that has a first emitter connected to the second electrode, a base coupled to the doped buried region, and a second emitter connected to an eighth electrode of the second conductivity type, wherein the eighth electrode is in the fifth doped well and the doped buried region is below the second doped substrate region and the third and fourth doped wells.

17. The ESD protection device of claim 12 wherein when the first node is biased high with reference to the second node, current flows from the second electrode to the fifth electrode.

18. The ESD protection device of claim 13, wherein:
the first conductivity type is p-type conductivity;
the second conductivity type is n-type conductivity;
the first node is a positive node; and
the second and third nodes are negative nodes.

* * * * *